United States Patent [19]
Hosokawa et al.

[11] Patent Number: 5,483,543
[45] Date of Patent: Jan. 9, 1996

[54] TEST SEQUENCE GENERATION METHOD

[75] Inventors: Toshinori Hosokawa, Daito; Akira Motohara, Kobe; Mitsuyasu Ohta, Katano, all of Japan

[73] Assignee: Matsushita Electric Industrial Co., Ltd., Osaka, Japan

[21] Appl. No.: 948,353

[22] Filed: Sep. 23, 1992

[30] Foreign Application Priority Data

Sep. 30, 1991 [JP] Japan .................................. 3-250883

[51] Int. Cl.$^6$ .......................... G06F 11/27; G06F 11/273
[52] U.S. Cl. ............................................. 371/23; 371/27
[58] Field of Search ................................. 371/23, 27, 41, 371/37.7; 364/580

[56] References Cited

U.S. PATENT DOCUMENTS 5,189,365  2/1993  Ikeda et al. ............................ 371/23 X
5,257,268  10/1993  Agraveal et al. ...................... 371/23 X

OTHER PUBLICATIONS

Niermann, et al.; "HITEC: A Test Generation Package for Sequential Circuits", published pursuant to a European Design Automation Conference held in 1991. 25–28 Feb.
"Stuck at Fault Testing" of Fault Tolerant Computing Theory and Techniques, vol. I, by Prentice–Hall, Englewood Cliff, N.J.

Schultz, "Essential: An Efficient Self–Learning Test Pattern Generation Algorithm for Sequential Circuits," IEEE International Test Conference, pp. 28–37, Aug. 1989.

*Primary Examiner*—Emanuel T. Voeltz
*Assistant Examiner*—Shahi Kamini
*Attorney, Agent, or Firm*—Stevens, Davis, Miller & Mosher

[57] ABSTRACT

A method for generating a test sequence for a fault in a sequential circuit to provide high fault coverage. In one embodiment (FIG. 1), a circuit state, which a system fails to justify, is stored as an illegal state in a step 107. In a step 103, a target fault is selected. In a step 104, the system performs its fault propagation processing to generate a test sequence and propagate the target fault from a fault location to any external output pin in such a manner that the circuit state does not coincide with the illegal state set stored in the step 107, and judges the success or failure of the sequence generation. In a step 105, the system performs its state initialization processing to generate a test sequence and transfer the state of the circuit from its initial state to a state when the fault was sensitized in such a manner that the circuit state does not coincide with the illegal state set stored in the step 107, and judges the success or failure of the sequence generation. Since the circuit state when the system fails to justify the state is stored as the illegal state so that a circuit state at the time of generating a subsequent test sequence is prevented from coinciding with the illegal state set, the possibility of the successful test sequence generation can be increased and thus the test sequence generation system can achieve high fault coverage.

11 Claims, 7 Drawing Sheets

ILLEGAL STATE

| SIGNAL LINE 407 | SIGNAL LINE 408 |
|---|---|
| LOGICAL VALUE 1 | LOGICAL VALUE 1 |

TEST SEQUENCE GENERATION METHOD

BACKGROUND OF THE INVENTION

The present invention relates to a method for generating a test sequence for a fault in a digital circuit.

A conventional test sequence generation method is disclosed in Chapter 1, 1. 4. 2 "Stuck at Fault Testing" of a reference books entitled "FAULT TOLERANT COMPUTING THEORY AND TECHNIQUES", Volume I, issued from PRENTICE-HALL, Englewood Cliff, N.J.; and a conference document entitled "ESSENTIAL: An Effective Self-Learning Test Pattern Generation Algorithm for Sequential Circuits", IEEE Proc. Int Test Conf., pp 28–37, August 1989 and its literatures. The prior art test sequence generation method will be explained by referring to the attached drawings.

FIG. 3 shows a prior art method for generating a test sequence for a fault in a sequential circuit. In the drawing, a step 301 represents the start of the test sequence generation processing of the sequential circuit. In a step 302, the system judges whether or not there are a group of faults that are not detected yet and also that are not selected as targets of test sequences generation. When the system judges in the step 302 that there are a group of faults that are not detected yet and also that are not selected as targets of the test sequence generation, the system goes to a step 303. Otherwise, the system proceeds to a step 307.

In the step 303, the system selects a fault as a target fault from the group of faults that are not detected yet and also that are not selected as targets of the test sequence generation. In a step 304, the system performs its fault propagation processing of the target fault selected in the step 303, that is, it generates a sequence to propagate the target fault from a fault location to any external output pin, and judges whether or not its generation of the sequence was successful. If the fault propagation processing was successful, then the system goes to a step 305; whereas, if the fault propagation processing failed, then the system goes to the step 302 for processing of the next fault.

In the step 305, the system performs its state initialization processing, that is, it generates a sequence to transfer the state of the circuit from its initial state to the state of the circuit when the fault is sensitized. If generation of the sequence is successful, then the system goes to a step 306; while if it fails, then the system goes to the step 302 for processing of the next fault.

In the step 306, the system executes a fault simulation with the test sequence of the target fault selected in the step 303, and deletes the faults detected at any external output pin from the group of faults not detected yet.

FIG. 4A is a sequential circuit having three flip-flops for explaining the processing of the prior art test sequence generation method for sequential circuits. FIG. 4B is a circuit diagram for explaining the behavior of the sequential circuit of FIG. 4A when test sequence generation is carried out for a fault in the sequential circuit. FIG. 4C is a circuit diagram for explaining the behavior of the sequential circuit of FIG. 4A when the test sequence generation is carried out for another fault different from the fault in FIG. 4B. In these drawings, reference numerals 401 to 405 denote external input pins. Numeral 406 denotes an external output pin. Numerals 407 to 409 denote D flip-flops. Numerals 410 to 412 denote 2-input AND gates. Numeral 413 denotes a 2-input OR gate and 414 denotes a 2-input NOR gate. Numeral 415 denotes a stuck-at-0 fault in a signal line connected to an output of the AND gate 411. Numeral 416 denotes a stuck-at-1 fault in a signal line connected to an output of the external input pin 405. Numbers encircled by circles on the pins and gates 401 to 414 represent logical values assigned to the associated signal lines. Further, a fault signal value is expressed in the form of a fault-free value/fault value.

Explanation will next be made as to the processing of the prior art test sequence generation method for the sequential circuit by referring to FIGS. 4A to 4C.

First, the system selects the fault 415 as a target fault and performs its test sequence generation processing. As shown in FIG. 4B, the system performs its fault propagation processing to propagate the fault 415 to the external output pin 406. Since the fault 415 is of a stuck-at-0 fault, test sequence generation system traces to assign the output of AND gate 411 to logical value '1', to assign the output of DFF 407 to logical value '1', and to assign the output of OR gate 413 to logical value '1'. Since the D flip-flop 407 is a pseudo external input, a logical value '1' is assigned thereto. Further, in order that the output of the OR gate 413 has a logical value '1', either one of outputs of the flip-flops 408 and 409 must have a logical value '1'. In the illustrated example, the logical value '1' is assigned to the flip-flop 408. As a result, the fault 415 is excited and the output of the AND gate 411 has a fault signal of 1/0. In order to propagate the fault signal 1/0 of the excited AND gate 411 to the external output pin 406, the logical value '1' is assigned to the input pin 405 having no fault signal because of the AND gate 412. Thus, when the output of the flip-flops 407 and 408 have both logical value '1' and the logical value '1' is provided to the external output pin 405, the fault 415 is excited and propagated to the external output pin 406.

The circuit state when the flip-flop 407 has a logical value '1' and the flip-flop 408 has a logical value '1' must be justified. First, to justify the logical value '1' of the flip-flop 407, the logical value '1' must be assigned to the external input pin 401. Since the logical value '1' is assigned to the external input pin 401, the output of the NOR gate 414 has a logical value '0'. To justify the logical value '1' of the flip-flop 408, on the other hand, the output of the gate 414 must have a logical value '1'. As a result, a conflict takes place and the system fails to find the test sequence generation for the fault 415.

Next, the system selects the fault 416 as the next target fault and performs the test sequence generation processing. As shown in FIG. 4C, the system performs its fault propagation operation to propagate the fault 416 to the external output pin 406. First, since the fault 416 is of a stuck-at-1 fault, a logical value '0' is assigned to the external output pin 405. This results in that the fault 416 is excited and a fault signal of 0/1 is propagated to the external input pin 405. In order to propagate the excited fault to the external output pin 406, the output of the gate 411 that the fault signal never reaches must have a logical value '1' because of the AND gate 412. For the output of the gate 411 to have a logical value '1', the output of the flip-flop 407 and the output of the gate 413 must have the logical value '1'. Since the flip-flop 407 is a pseudo external input, a logical value '1' is assigned thereto. Further, for the output of the gate 413 to have a logical value '1', either one of the outputs of the flip-flops 408 and 409 must have a logical value '1'. In this case, a logical value '1' is assigned to the flip-flop 408. Accordingly, when the output of the flip-flops 407 and 408 have respectively a logical value '1' and a logical value '0' is provided to the external output pin 405, the fault 416 is excited and propagated to the external output pin 406.

Next, the processing of justifying the circuit state that the flip-flop 407 has a logical value '1' and the flip-flop 408 has a logical value '1' is carried out. However, since it is impossible to satisfy the condition that the flip-flop 407 should have a logical value '1' and the flip-flop 408 have a logical value '1' as mentioned above, the system fails to find the test sequence generation for the fault 416.

SUMMARY OF THE INVENTION

Such a test sequence generation method as mentioned above, however, has had a problem that, even for such a fault that test sequence generation can be successful when the state of a circuit is changed, its test sequence generation becomes impossible, thus fault coverage cannot be increased.

In view of the above circumstances, it is an object of the present invention to provide a test sequence generation method which can solve the above problem in the prior art and can exhibit a high fault coverage.

A test sequence generation method for finding a test sequence of a stuck-at-fault in a sequential circuit in accordance with one aspect of the present invention comprises a first step of storing as an illegal state a state of the circuit when failing to perform test sequence generation for justifying the circuit state and a second step of generating test sequence generation for preventing coincidence of a state of the circuit at the time of generating another test sequence of another stuck-at-fault with respect to the stored illegal states of the circuit.

A test sequence generation method for finding a test sequence of a stuck-at-fault in a sequential circuit in accordance with another aspect of the present invention comprises a first step of storing as an illegal state a state of the circuit at the time of failing to perform test sequence generation for justifying the circuit state and a second step, performed immediately after the first step, of finding again the test sequence of the stuck-at-fault to prevent the circuit state from coinciding with the illegal state.

In the test sequence generation method of one aspect of the present invention, when it is desired for the system to generate a test sequence of a target fault and the system fails to justify a circuit state, the system stores the circuit state as an illegal state so that, when the system performs test sequence generation for the subsequent target fault, the circuit state does not coincide with the stored illegal states. Since the possibility of the successful test sequence generation for the target fault becomes high, the test sequence generation system can achieve high fault coverage.

In the test sequence generation method of another aspect of the present invention, when it is desired for the system to generate a test sequence of a target fault and the system fails to justify a circuit state, the system stores the circuit state as an illegal state so that the system again executes the test sequence generation for the target fault to prevent the circuit state from coinciding with the illegal state set. Since the possibility of the successful test sequence generation for the target fault becomes high, the test sequence generation system can achieve a high fault coverage.

DESCRIPTION OF THE PREFERRED EMBODIMENTS (Embodiment 1)

Figure 1:
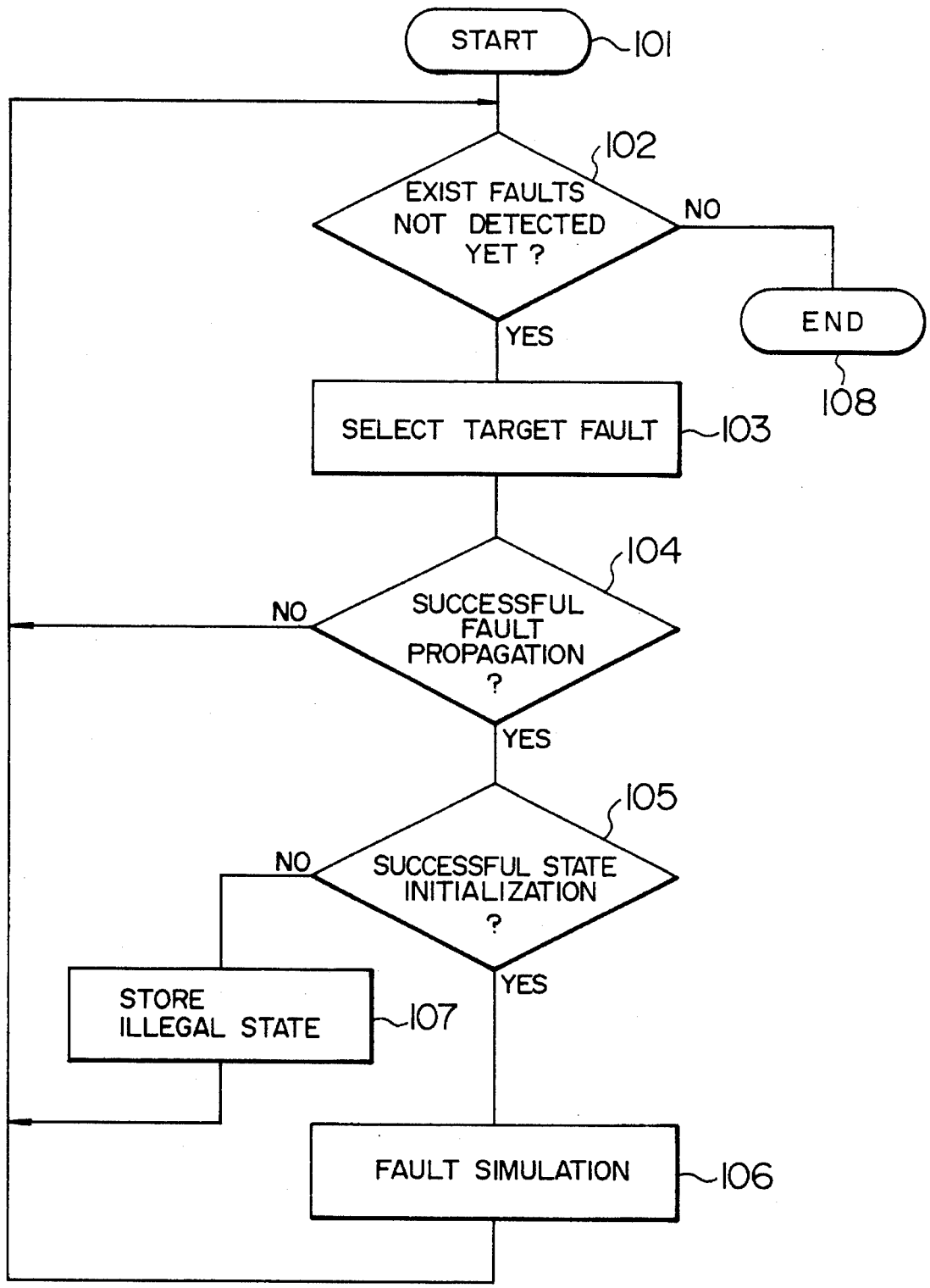
FIG. 1 is a flowchart for explaining the processing of a method for generating a test sequence for a fault in a sequential circuit in accordance with a first embodiment of the present invention.

FIG. 1 is a flowchart for explaining the processing of a method for generating a test sequence for a fault in a sequential circuit in accordance with a first embodiment of the present invention.

More specifically, a step 101 denotes the start of test sequence generation processing for the sequential circuit. In a step 102, first, the system judges whether or not there are a group of faults that are not detected yet and also that are not selected as targets of test sequences generation. When the system judges in the step 102 that there are a group of faults that are not detected yet and also that are not selected as targets of the test sequence generation, the system goes to a step 103. Otherwise, the system proceeds to a step 108.

In the step 103, the system selects one as a target fault from the group of faults that are not detected yet and also that are not selected as targets of the test sequence generation. In a step 104, the system performs its fault propagation processing of the target fault selected in the step 103, that is, it generates a sequence to propagate the target fault from a fault location to any external output pin, and judges whether or not its generation of the sequence was successful. If the fault propagation processing was successful, then the system goes to a step 105; whereas, if the fault propagation processing failed, then the system goes to the step 102 for processing of the next fault. In this connection, during the fault propagation processing, it is prevented that the circuit state coincides with the illegal state set stored in the step 107.

In the step 105, the system performs its state initialization processing, that is, it generates a sequence to transfer the state of the circuit from its initial state to the state of the circuit when the fault was sensitized, and then judges the success or failure of the sequence generation. If the sequence generation is successful, then the system goes to a step 106;

while if it fails, then the system goes to a step 107. In this connection, during the state initialization, it is prevented that the circuit state coincides with the illegal state set stored in the step 107.

In the step 106, the system executes a fault simulation with the test sequence of the target fault selected in the step 103, and deletes the fault detected at any external output pin from the group of faults not detected yet.

In the step 107, next, the circuit state when the system fails to justify the state in the step 105 is stored as an illegal state and then the system goes to the step 102 for processing of the next fault. The step 108 denotes end of the test sequence generation processing of the fault in the sequential circuit.

Figure 4A:
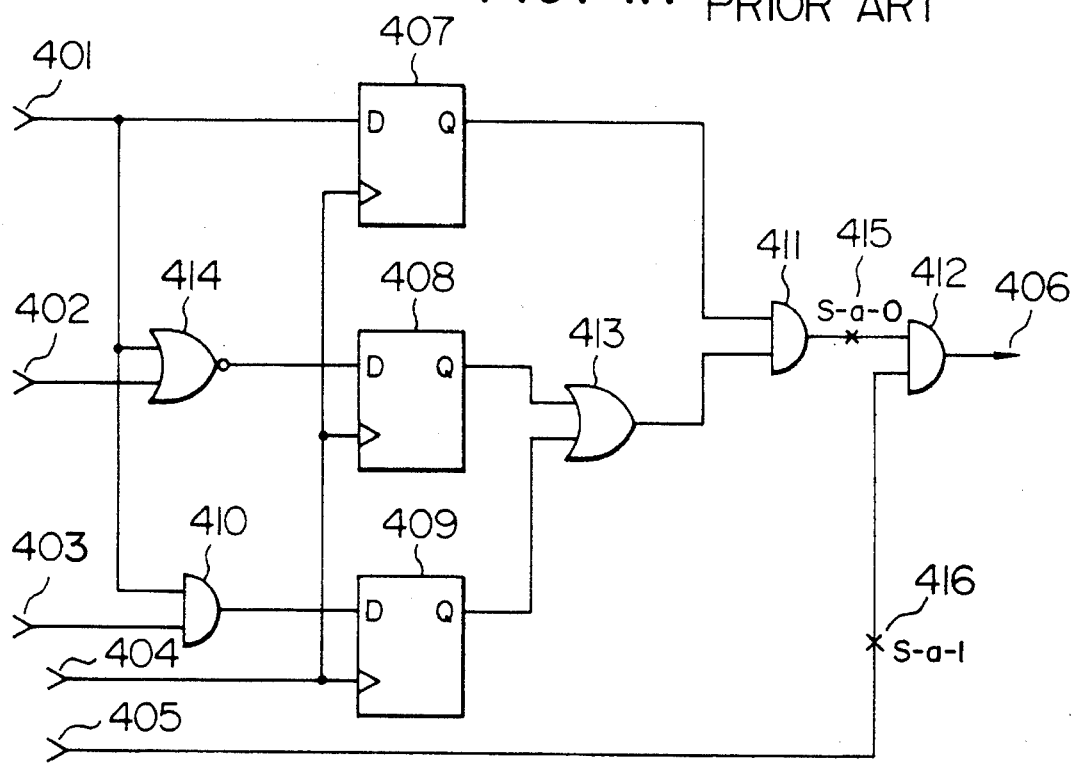
FIG. 4A is a sequential circuit having three flip-flops for explaining the processing of the prior art test sequence generation method.
Figures 5A, 5B:
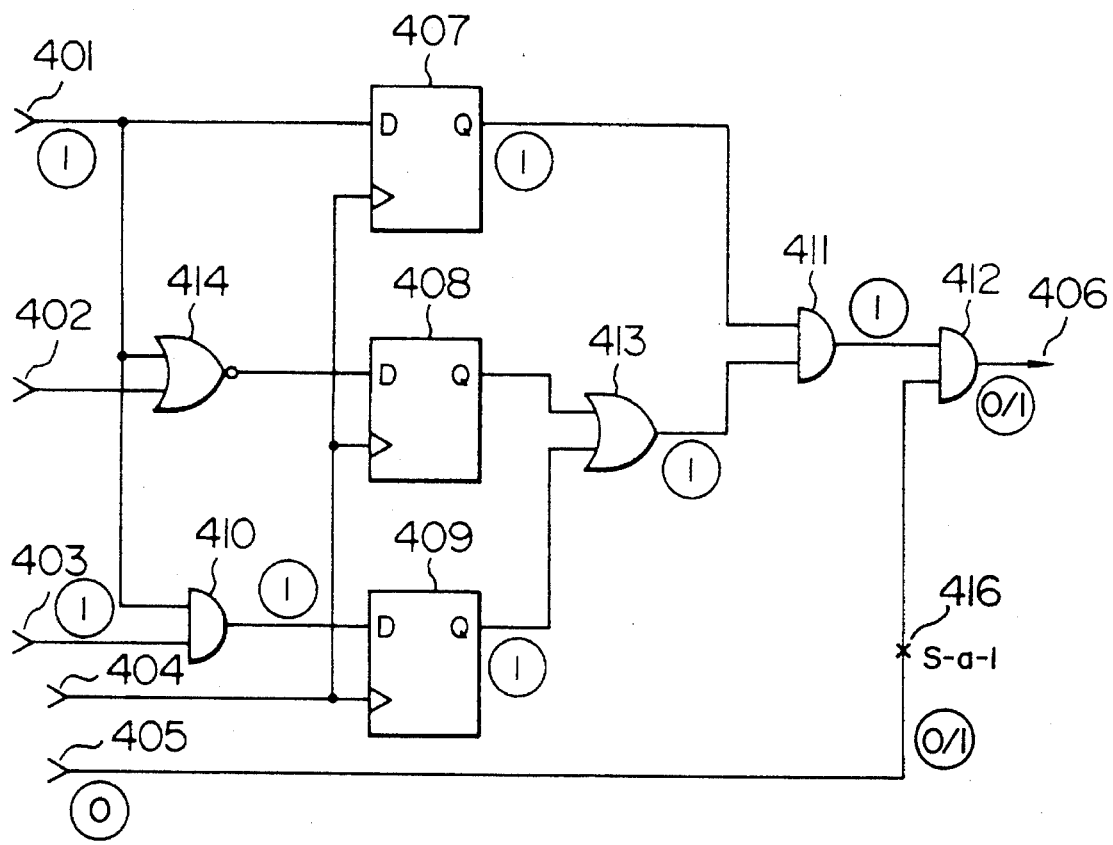
FIG. 5A is a diagram conceptionally showing a state of the circuit of FIG. 4A stored as an illegal state when the system fails to generate the test sequence for the fault in the circuit of FIG. 4A.
FIG. 5B is a circuit diagram for explaining the processing of the test sequence generation method in accordance with the first embodiment of the present invention.

FIGS. 5A and 5B show diagrams for explaining the processing of a test sequence generation method for a sequential circuit in accordance with the first invention, wherein FIG. 5A is a diagram conceptually showing a state of the circuit of FIG. 4A stored as an illegal state when the system fails to generate the test sequence for the fault in the circuit of FIG. 4A, while FIG. 5B is a circuit diagram for explaining the processing of the test sequence generation method. As shown in FIG. 5A, data indicating that the output of the flip-flops 407, 408 cannot both have the logical value '1' at the same time is stored.

Next, the system selects the fault 416 as the next target fault and performs the test sequence generation processing. As shown in FIG. 5B, the system performs its fault propagation processing to propagate the fault 416 to the external output pin 406. First, since the fault 416 is of a stuck-at-1-fault, a logical value '0' is assigned to the external input pin 405. This results in that the fault 416 is excited and a fault signal of 0/1 is propagated to the external input pin 405. In order to propagate the excited fault to the external output pin 406, the output of the gate 411 that the fault signal never reaches must have a logical value '1' because of the AND gate 412. For the output of the gate 411 to have a logical value '1', the output of the flip-flop 407 and the gate 413 must have the logical value '1'. Since the output of the flip-flop 407 is a pseudo external input, a logical value '1' is assigned thereto. Further, for the output of the gate 413 to have a logical value '1', either one of the outputs of the flip-flops 408 and 409 must have a logical value '1'. However, it will be seen from FIG. 5A that, when the illegal state is searched, the flip-flops 407 and 408 can not have the logical value '1' at the same time. In this case, a logical value '1' is assigned to the flip-flop 407 and thus the logical value '1' cannot be assigned to the flip-flop 408. Accordingly, when the output of the flip-flops 407 and 409 have respectively a logical value '1' and a logical value '0' is provided to the external output pin 405, the fault 416 is excited and propagated to the external output pin 406.

Next, the processing of justifying the circuit state such that the output of the flip-flop 407 has a logical value '1' and the output of the flip-flop 409 has a logical value '1' is carried out. For justifying the output of the flip-flop 407 having the logical value '1', a logical value '1' must be assigned to the external input pin 401. As a result of assigning the logical value '1' to the external input pin 401, either one of the inputs of the AND gate 410 has a logical value '1'. For justifying the output of the flip-flop 409 having the logical value '1', the output of the gate 410 must have a logical value '1'. For the output of the gate 410 to have a logical value '1', the external input pins 401 and 403 must have a logical value '1'. In the illustrated example, since the logical value '1' is already assigned to the external input pin 401, when a logical value '1' is assigned to the external input pin 403, the output of the flip-flops 407 and 409 having the logical value '1' can be justified. It will be appreciated that the logical value '1' is applied to the external input pins 401 and 403 and a clock pulse is applied to the external input pin 404 so that the output of the flip-flops 407 and 409 both have a logical value '1', whereby, when a logical value '0' is applied to the external input pin 405, the fault 416 can be detected at the external output pin 406.

In this way, in accordance with the first embodiment of the present invention, when the system performs its test sequence generation for a target fault and fails to attain the state justification processing the system stores the circuit state as an illegal state, so that, when the system performs its test sequence generation for another target fault, the circuit state is prevented from coinciding with the illegal state. As a result, since the system can successfully perform the test sequence generation, the test sequence generation can achieve high fault converage.

(Embodiment 2)

Figure 2:
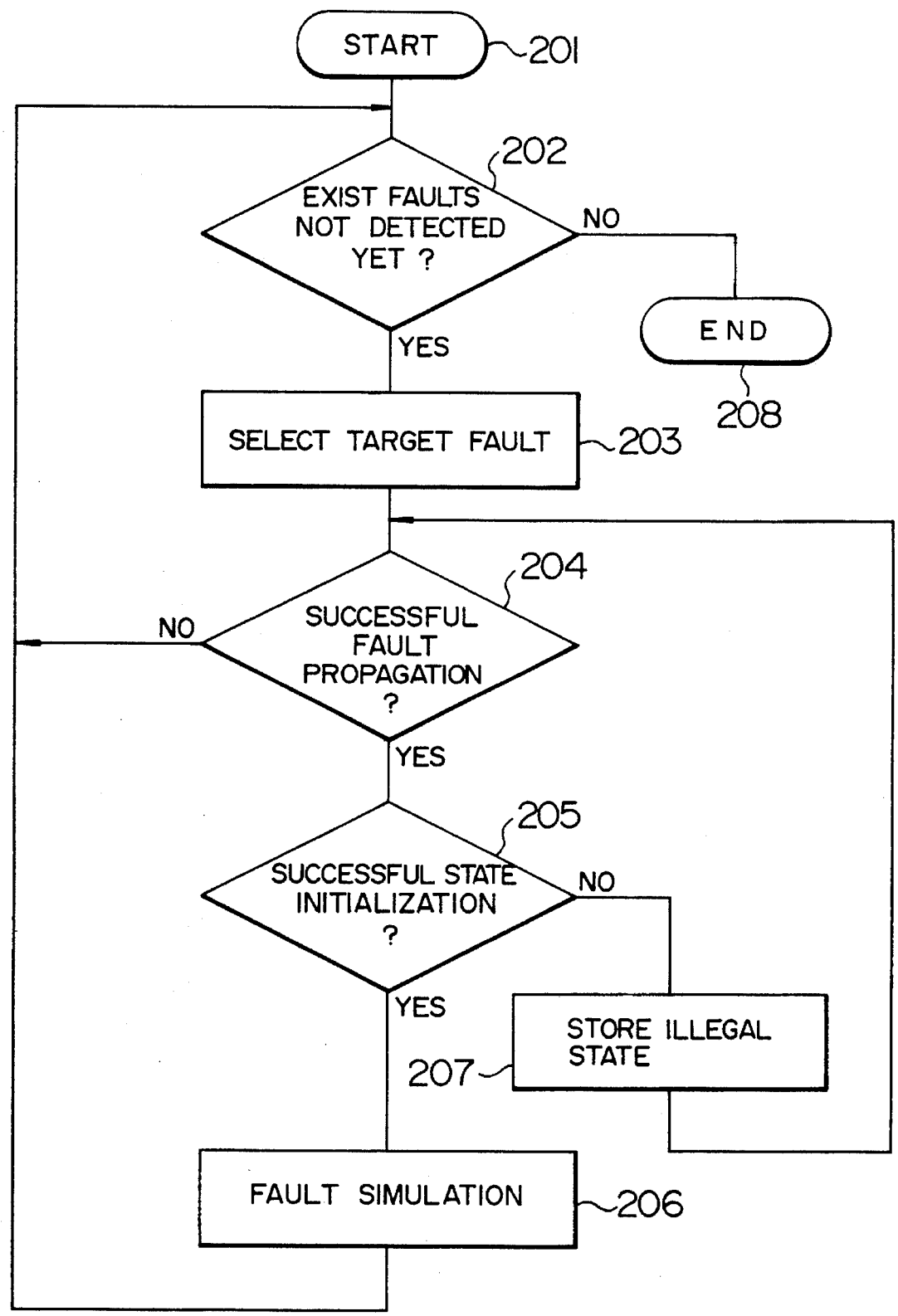
FIG. 2 is a flowchart for explaining the processing of a method for generating a test sequence for a fault in a sequential circuit in accordance with a second embodiment of the present invention.
Figure 3:
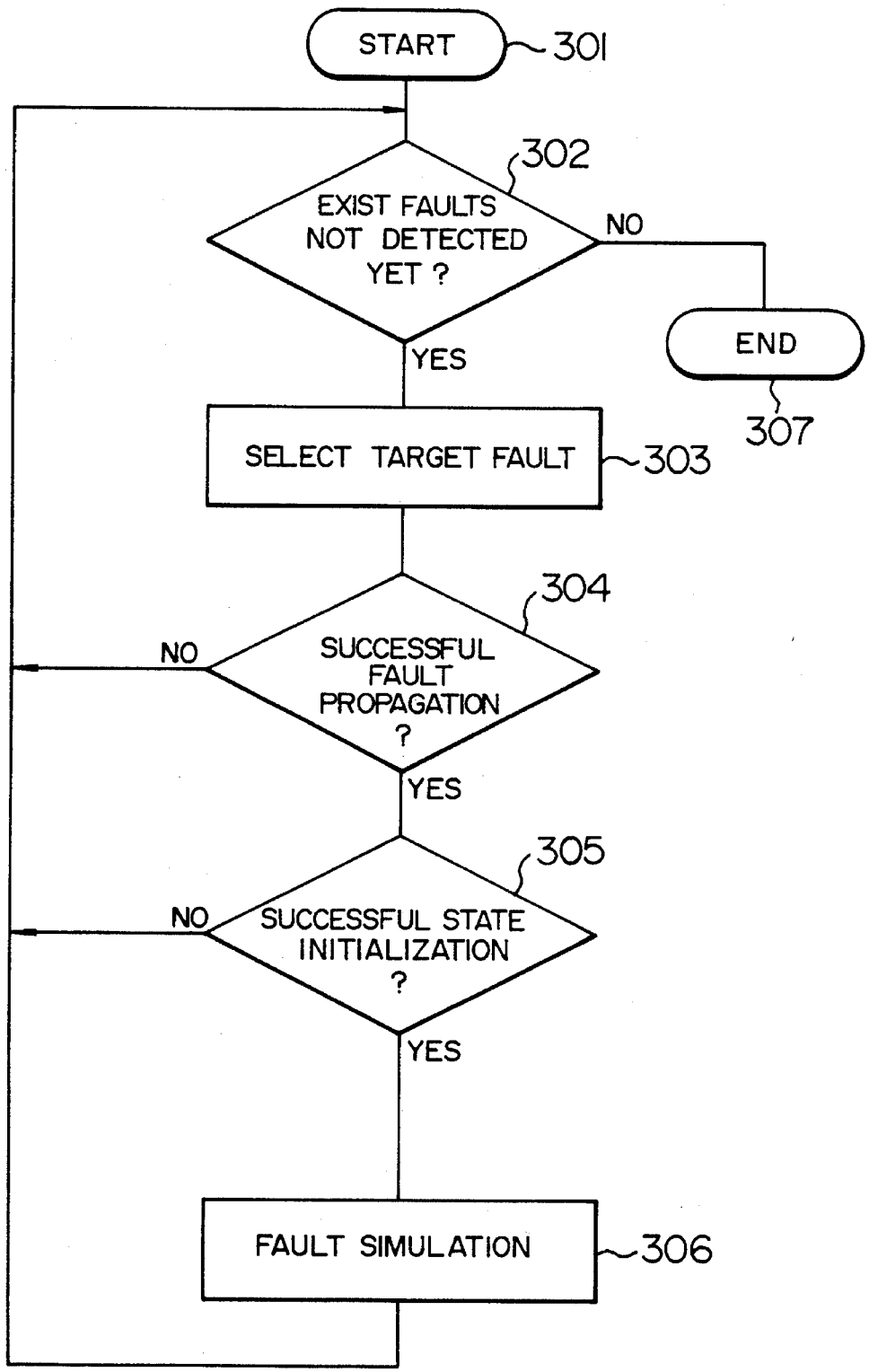
FIG. 3 is a flowchart for explaining the processing of a prior art method for generating a test sequence for a fault in a sequential circuit.

FIG. 2 is a flowchart for explaining the processing of a method for generating a test sequence for a fault in a sequential circuit in accordance with a second embodiment of the present invention.

More specifically, a step 201 denotes the start of test sequence generation processing for the sequential circuit. In a step 202, first, the system judges whether or not there are a group of faults that are not detected yet and also that are not selected as targets of test sequences generation. When the system judges in the step 202 that there are a group of faults that are not detected yet and also that are not selected as targets of the test sequence generation, the system goes to a step 203. Otherwise, the system proceeds to a step 208.

In the step 203, the system selects one as a target fault from the group of faults that are not detected yet and also that are not selected as targets of the test sequences generation. In a step 204, the system performs its fault propagation processing of the target fault selected in the step 203, that is, it generates a sequence to propagate the target fault from a fault location to any external output pins, and judges whether or not its generation of the sequence was successful. If the fault propagation processing was successful, then the system goes to a step 205; whereas, if the fault propagation processing failed, then the system goes to the step 202 for processing of the next fault. In this connection, during the fault propagation operation, it is prevented that the circuit state coincides with the illegal state set stored in the step 207.

In the step 205, the system performs its state initialization processing, that is, it generates a sequence to transfer the state of the circuit from its initial state to the state of the circuit when the fault was sensitized and then judges the success or failure of the sequence generation. If the sequence generation is successful, then the system goes to a step 206; while if it fails, then the system goes to a step 207. In this connection, during the state initialization processing, it is prevented that the circuit state coincides with the illegal state set stored in the step 207.

In the step 206, the system executes a fault simulation with the test sequence of the target fault selected in the step 203, and deletes the fault detected at any external output pins from the group of faults not detected yet.

In the step 207, next, the circuit state when the system fails to justify the state in the step 205 is stored as an illegal state and then the system goes to the step 204 to again perform the test sequence generation for the failed target fault. The step 208 denotes end of the test sequence generation processing of the fault in the sequential circuit.

Figure 4B:
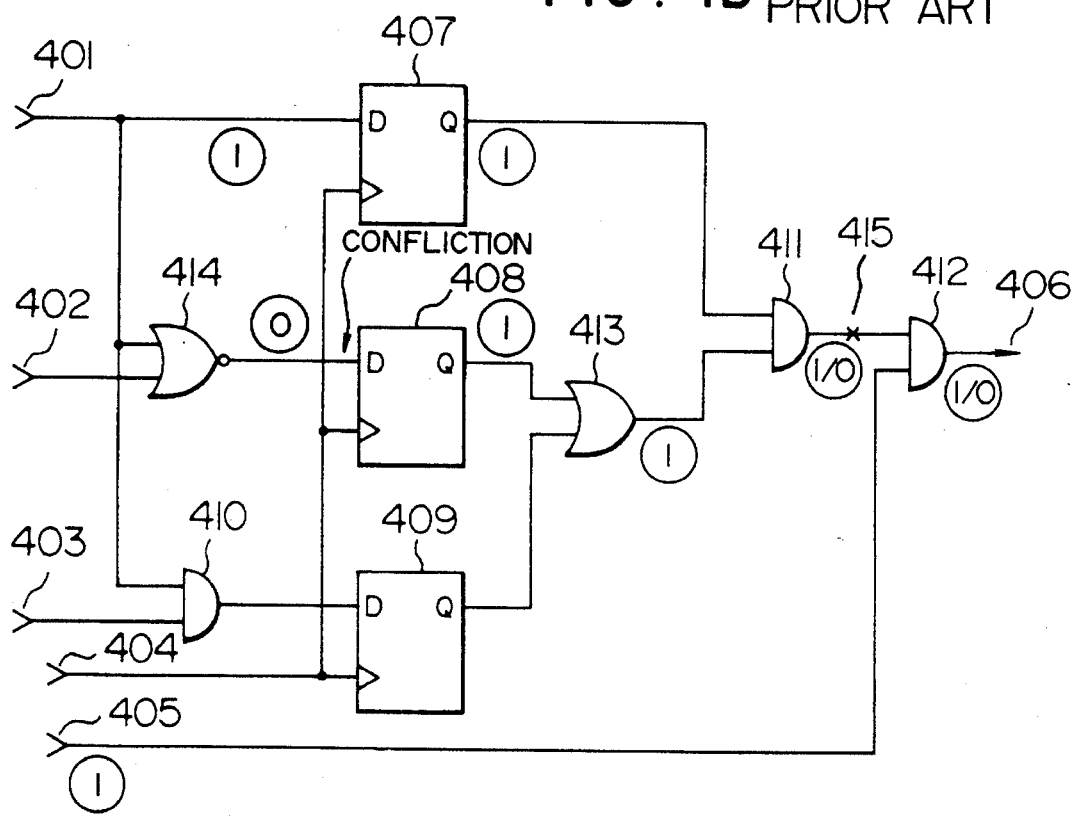
FIG. 4B is a circuit diagram of the sequential circuit for explaining the processing when test sequence generation is carried out for a fault in the sequential circuit.
Figure 4C:
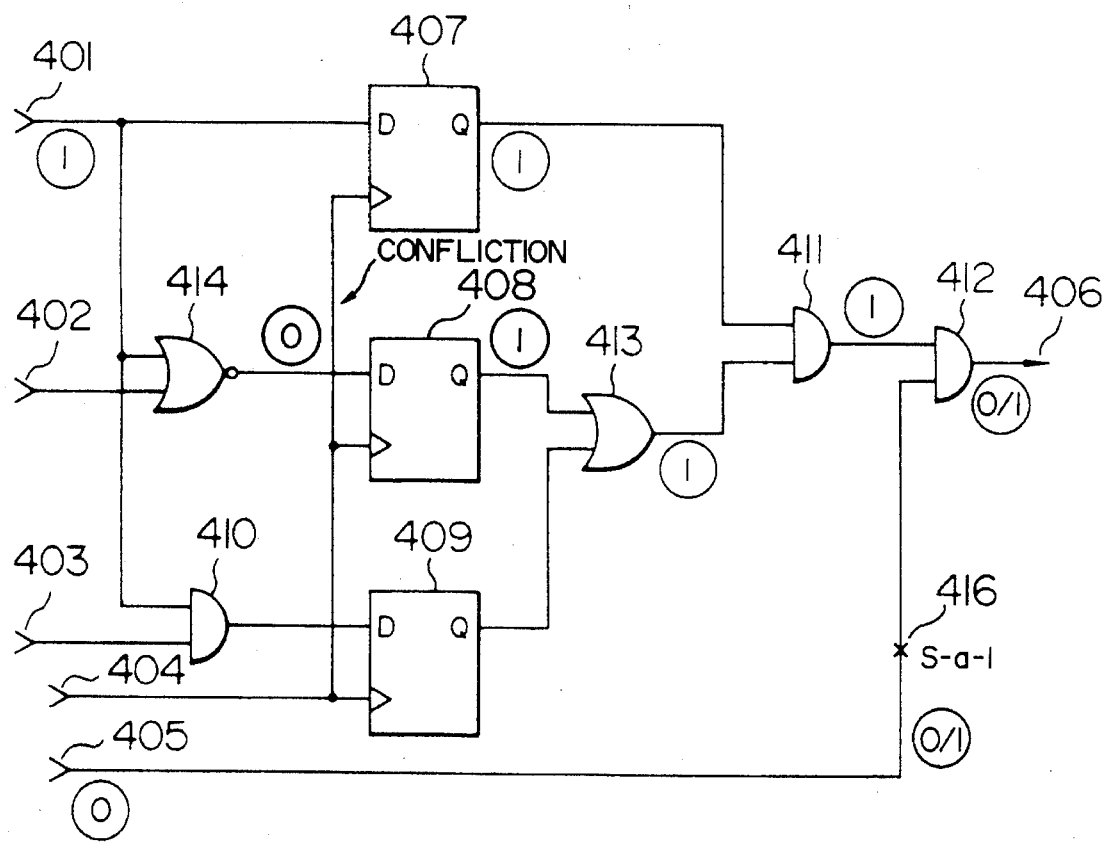
FIG. 4C is a circuit diagram of the sequential circuit for explaining the processing when test sequence generation is carried out for another fault different from the fault in FIG. 4B.
Figure 6:
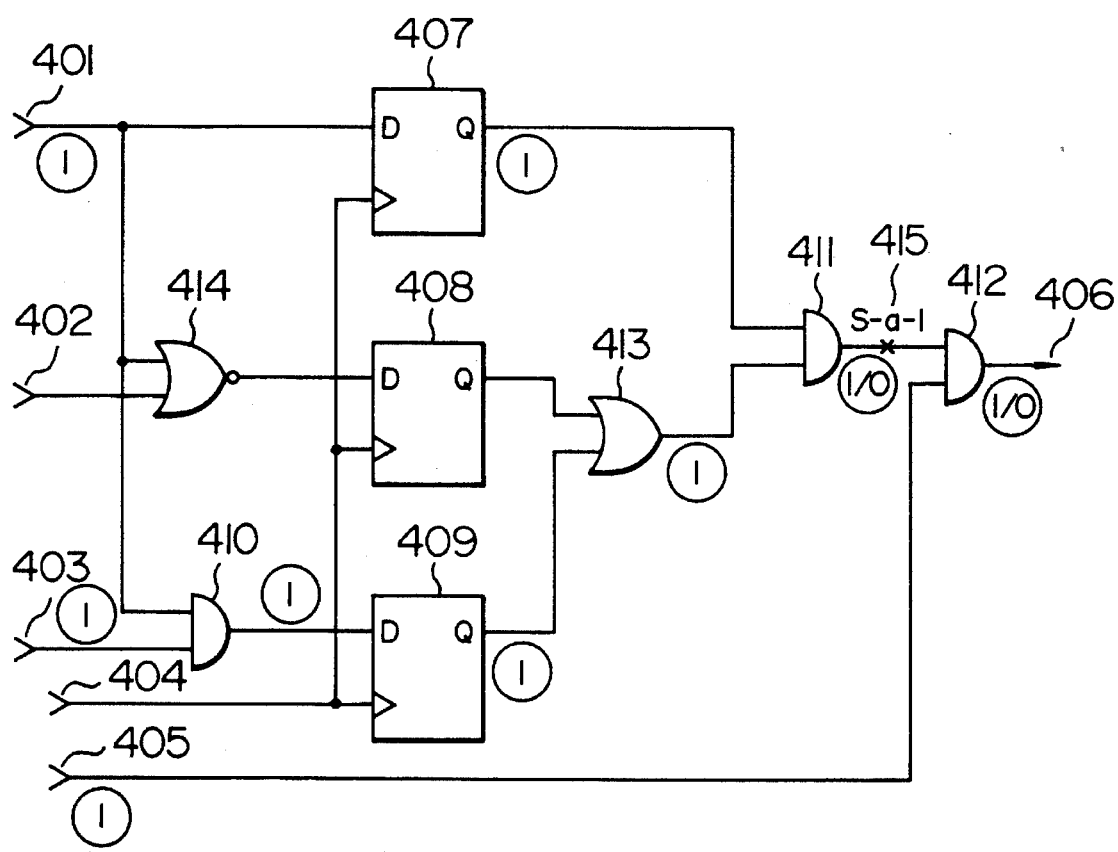
FIG. 6 is a circuit diagram for explaining the processing of the test sequence generation method in accordance with the second embodiment of the present invention.

FIG. 6 shows a circuit diagram for explaining the processing of a test sequence generation method for the fault 415 in the sequential circuit of FIG. 4A in accordance with the second invention. The system first performs its test sequence generation processing for the fault 415. As have already been explained in connection with FIG. 4B, however, since justification of the output of the flip-flops 407 and 408 having both the logical value '1' cannot be attained at the same time, the system fails to perform the test sequence generation processing for the fault 415. In this case, data indicating that the output of the flip-flops 407 and 408 cannot have both the logical value '1' at the same time, is stored as shown in FIG. 5A.

Next, the system again performs the test sequence generation processing for the fault 415. As shown in FIG. 6, the system performs the fault propagation processing to propagate the fault 415 to the external output pin 406. First, since the fault 415 is of a stuck-at-0 fault, the flip-flop 407 and the gate 413, whose outputs are connected to the gate 411, both have a logical value '1' and thus the output of the gate 411 has a logical value '1'. Since the output of the flip-flop 407 is a pseudo external input, a logical value '1' is assigned thereto. For the output of the gate 413 to have a logical value '1', either one of the outputs of the flip-flops 408 and 409 must have the logical value '1'. However, it will be seen that, when the illegal state is searched, the output of the flip-flops 407 and 408 must not have a logical value '1' at the same time. Since a logical value '1' is already assigned to the output of the flip-flop 407, in this example, a logical value '1' cannot be assigned to the flip-flop 408 and thus a logical value '1' is assigned to the flip-flop 409. As a result, the fault 415 is excited and the output of the gate 411 has a fault signal of 1/0. Further, in order to propagate the fault signal 1/0 of the output of the excited gate 411 to the external output pin 406, a logical value '1' assigned to the external input pin 405 that the fault signal never reaches because of the AND gate 412. Accordingly, when the output of the flip-flops 407 and 409 have respectively a logical value '1' and a logical value '1' is provided to the external input pin 405, the fault 415 is excited and propagated to the external output pin 406.

Next, the processing of justifying the circuit state that the output of the flip-flop 407 has a logical value '1' and the flip-flop 409 has a logical value '1', is carried out. For justifying the output of the flip-flop 407 having the logical value '1', a logical value '1' must be assigned to the external input pin 401. As a result of assigning the logical value '1' to the external input pin 401, either one of the inputs of the AND gate 410 has a logical value '1'. For justifying the output of the flip-flop 409 having the logical value '1', the output of the gate 410 must have a logical value '1'. For the gate 410 to have a logical value '1', the external input pins 401 and 403 must have a logical value '1'. In the illustrated example, since the logical value '1' is already assigned to the external input pin 401, when a logical value '1' is assigned to the external input pin 403, the output of the flip-flops 407 and 409 having the logical value '1' can be justified. It will be appreciated that the logical value '1' is applied to the external input pins 401 and 403 and a clock pulse is applied to the external input pin 404 so that the output of the flip-flops 407 and 409 both have a logical value '1', whereby, when a logical value '1' is applied to the external input pin 405, the fault 415 can be detected at the external output pin 406.

In this way, in accordance with the second embodiment of the present invention, when the system performs its test sequence generation for a target fault and fails to attain the state justification processing, the system stores the circuit state as an illegal state, in such a manner that, when the system again performs the test sequence generation for the same target fault to prevent the circuit state from coinciding with the illegal state set. As a result, since the system can successfully perform the test sequence generation, the test sequence generation system can achieve a high fault coverage.

As has been explained in the foregoing, since the test sequence generation method in accordance with the present invention solves such a problem that the test sequence generation processing results in an impossible circuit state and thus in a low fault coverage in the prior art test sequence generation method, a test sequence generation system can achieve a high fault coverage.

What is claimed is:

1. A test sequence generation method for finding test sequences of stuck-at-faults in a sequential circuit, said method comprising:

(a) storing illegal state data corresponding to a circuit state resulting from a generated test pattern for justifying the circuit state to allow testing of a first one of said stuck-at-faults which was unsuccessful; and (b) generating another test pattern for testing another one of said stuck-at-faults while preventing coincidence of a circuit state of the sequential circuit with respect to the illegal state data stored in step (a).

2. A test sequence generation method for finding a test sequence of a stuck-at-fault, said method comprising:

(a) storing illegal state data relating to a circuit state resulting from a generated test pattern for justifying the circuit state to allow testing of said stuck-at-fault which was unsuccessful; and (b) immediately after performing said step (a), generating another test sequence for [the] one of said stuck-at-fault and another stuck-at-fault while preventing coincidence of the circuit state with respect to the illegal state data stored in step (a).

3. A test sequence generation method for determining test sequences for stuck-at-faults in a sequential circuit, said method comprising:

(a) generating a first test pattern signal for justifying said sequential circuit to a first desired state to allow testing of a first one of said stuck-at-faults of said sequential circuit and supplying said first test pattern signal to said sequential circuit;

(b) determining whether said first test pattern signal is unsuccessful in justifying said sequential circuit to said first desired state;

(c) storing said first test pattern signal as illegal state data if said first test pattern signal is determined to be unsuccessful in said step (b);

(d) generating a second test pattern signal for justifying said sequential circuit to a second desired state to allow testing of a second one of said stuck-at-faults of said sequential circuit such that said second test pattern does not coincide with any stored illegal state data;

(e) determining whether said second test pattern signal is unsuccessful in justifying said sequential circuit to said second desired state; and (f) storing said second test pattern signal as illegal state data if said second test pattern signal is determined to be unsuccessful in said step (e).

4. A method according to claim 3, further comprising repeating said steps (d) to (f) for at least some remaining ones of said stuck-at-faults.

5. A method according to claim 3, further comprising repeating said steps (d) to (f) for all remaining ones of said stuck-at-faults.

6. A test sequence generation method for determining a test sequence for a stuck-at-fault in a sequential circuit, said method comprising:

(a) generating a first test pattern signal for justifying said sequential circuit to a desired state to allow testing of said stuck-at-fault of said sequential circuit and supplying said first test pattern signal to said sequential circuit;

(b) determining whether said first test pattern signal is unsuccessful in justifying said sequential circuit to said desired state;

(c) storing said first test pattern signal as illegal state data if said first test pattern signal is determined to be unsuccessful in said step (b);

(d) generating a second test pattern signal for justifying said sequential circuit to said desired state to allow testing of one of said stuck-at-fault and another stuck-at-fault of said sequential circuit such that said second test pattern does not coincide with any stored illegal state data;

(e) determining whether said second test pattern signal is unsuccessful in justifying said sequential circuit to said desired state; and (f) storing said second test pattern signal as illegal state data if said second test pattern signal is determined to be unsuccessful in said step (e).

7. A method according to claim 6, further comprising repeating said steps (d) to (f) until said step (e) determines that a test pattern signal is successful.

8. A test sequence generation method for finding test sequences to test a plurality of stuck-at-faults in a sequential circuit, comprising the steps of:

(a) assigning to (i) primary input pins and (ii) output pins of flip-flops of said sequential circuit a test pattern of signals to allow testing of an optional one of said plurality of stuck-at-faults;

(b) justifying for said optional one of said stuck-at-faults a circuit state of said sequential circuit resulting from assignment of said test pattern in step (a);

(c) storing illegal circuit state data corresponding to said circuit state resulting from assignment of said test pattern in step (a) when step (b) results in an unsuccessful justification of said circuit state;

(d) assigning to (i) said primary input pins and (ii) said output pins of said flip-flop of said sequential circuit an optional other test pattern of signals to allow testing of a corresponding other optional one of said plurality of stuck-at-faults while preventing coincidence of a circuit state of said sequential circuit resulting from assignment of said optional other test pattern of signals to said primary input pins and said output pins of said flip-flops of said sequential circuit with respect to said illegal circuit state data stored in step (c); and (e) justifying said circuit state of said sequential circuit resulting from assignment of said optional other test pattern of signals to said primary input pins and said output pins of said flip-flops of said sequential circuit to test said other optional one of said stuck-at-faults.

9. A test sequence generation method for finding test sequences to detect stuck-at-faults in a sequential circuit, comprising the steps of:

(a) assigning to (i) primary input pins and (ii) output pins of flip-flops of said sequential circuit a test pattern of signals to allow testing of an optional one of said stuck-at-faults;

(b) justifying for said one of said stuck-at-faults a circuit state of said sequential circuit resulting from assignment of said test pattern in step (a);

(c) storing illegal operation state data corresponding to said circuit state resulting from assignment of said test pattern in step (a) when step (b) results in an unsuccessful justification of said circuit state;

(d) just after storing step (c), assigning to (i) said primary input pins and (ii) said output pins of said flip-flops of said sequential circuit another test pattern of signals to allow testing of one of said optional one of said stuck-at-faults and another one of said stuck-at-faults while preventing coincidence of a circuit state of said sequential circuit resulting from assignment of said another test pattern to said primary input pins and said output pins of said flip-flops of said sequential circuit with respect to said illegal operation state data stored in step (c); and justifying said circuit state of said sequential circuit resulting from assignment of said another test pattern of signals to said primary input pins and said output pins of said flip-flops of said sequential circuit to test said optional one of said stuck-at-faults.

10. A method as in claim 8, wherein after plural stuck-at-faults have been tested and plural circuit states have resulted in unsuccessful justifications, step (c) includes storing plural items of illegal operation state data corresponding to said plural circuit states and step (d) includes preventing said coincidence with respect to all of said items of illegal operation state data.

11. A method as in claim 9, wherein after plural stuck-at-faults have been tested and plural circuit states have resulted in unsuccessful justifications, step (c) includes storing plural items of illegal operation state data corresponding to said plural circuit states and step (d) includes preventing said coincidence with respect to all of said items of illegal operation state data.

* * * * *